United States Patent
Fisher et al.

(10) Patent No.: US 8,983,817 B2
(45) Date of Patent: Mar. 17, 2015

(54) DYNAMIC LOAD BALANCING FOR ADAPTIVE MESHES

(75) Inventors: Mark S. Fisher, Bridgeton, MO (US); Mortaza Mani, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 614 days.

(21) Appl. No.: 13/328,435

(22) Filed: Dec. 16, 2011

(65) Prior Publication Data

US 2012/0089382 A1   Apr. 12, 2012

Related U.S. Application Data

(63) Continuation-in-part of application No. 12/328,607, filed on Dec. 4, 2008, now abandoned.

(51) Int. Cl.
| | |
|---|---|
| *G06G 7/50* | (2006.01) |
| *G06F 9/50* | (2006.01) |
| *G06F 17/50* | (2006.01) |
| *G01V 99/00* | (2009.01) |
| *G06K 9/62* | (2006.01) |
| *G06T 17/20* | (2006.01) |

(52) U.S. Cl.
CPC ............ *G06F 9/5083* (2013.01); *G01V 99/005* (2013.01); *G06K 9/622* (2013.01); *G06F 17/5018* (2013.01); *G06T 17/20* (2013.01)
USPC .................. 703/9; 703/13; 718/105; 709/201

(58) Field of Classification Search
CPC ............ G06F 17/5018; G06F 2217/17; G06F 9/5083; G01V 99/005
USPC .......................................................... 703/9
See application file for complete search history.

(56) References Cited

U.S. PATENT DOCUMENTS

| | | | |
|---|---|---|---|
| 5,587,922 | A | 12/1996 | Hendrickson et al. |
| 5,630,129 | A | 5/1997 | Wheat |
| 2005/0015571 | A1 | 1/2005 | Kaufman et al. |
| 2010/0134498 | A1 | 6/2010 | Pirzadeh et al. |

FOREIGN PATENT DOCUMENTS

| | | |
|---|---|---|
| EP | 1843805 A2 | 10/2007 |
| WO | WO0203856 A2 | 1/2002 |

OTHER PUBLICATIONS

Larwood et al, "Domain Decomposition Approach for Parallel Unstructured Mesh Generation", International Journal for Numerical Methods in Engineering, 58, pp. 177-188, 2003.*

(Continued)

*Primary Examiner* — Mary C Jacob
(74) *Attorney, Agent, or Firm* — Toler Law Group, PC

(57) ABSTRACT

A method for dynamic load balancing of a mesh, wherein the mesh is partitioned to find a solution using a plurality of processors, and wherein the partitions have become unbalanced. The present method allows large portions of the mesh to continue to progress towards a solution by only repartitioning a small percentage of the overall mesh. This is done by stripping cells along the partition interfaces using a marching method to form a free-cell region, repartitioning the free-cell region, and joining the repartitioned portions of the free-cell region with the remaining cells in a manner that will increase the efficiency of the solver.

20 Claims, 5 Drawing Sheets

(56) References Cited

OTHER PUBLICATIONS

Weatherill et al, "Aerospace Simulations on Parallel Computers Using Unstructured Grids", International Journal for Numerical Methods in Fluids, 40, pp. 171-187, 2002.* deCougny et al, "Parallel Volume Meshing Using Face Removals and Hierarchical Repartitioning", Rensselaer Polytechnic Institute, Feb. 16, 1998.*

Owen, Steven, "A Survey of Unstructured Mesh Generation Technology", in IMR, pp. 239-267, 1998.*

Dorneles, et al., "Parallel Computational Model with Dynamic Load Balancing in PC Clusters", VECPAR 2004, LNCS 4302, pp. 268-479, 2005.

Horton, et al, "A Multi-Level Diuffusion Method for Dynamic Load Balancing", Parallel Computing, 19, 1993, pp. 209-218.

Karypis, et al., "Parmetic Parallel Graph Partitioning and Sparse Matrix Ordering Library", Version 3.1, University of Minnesota Department of Computer Science and Engineering, Aug. 2003.

Kurc, et al., "An Iterative Parallel Workload Balancing Framework for Direct Condensation of Substructures", Comput. Methods Appl. Engrg. 196, 2007, 2084-2096.

Oliker, et al., "PLUM: Parallel Load Balancing for Adaptive Unstructured Meshes", Journal of Parallel and Distributed Computing 52, 150-177, 1998.

Schloegel, et al., "Graph Partitioning for High Performance Scientific Simulations", University of Minnesota, Department of Computer Science and Engineering, 1999.

Biswas, et al., "Load Balancing Unstructured Adaptive Grids for CFD Problems", 1997, Eighth SIAM Conference on Parallel Processing for Scientific Computing, pp. 1-8.

Karypis, et al., "Multilevel Graph Partitioning Schemes" (1995), pp. 1-12.

Schlogel, et al., Dynamic Repartitioning of Adaptively Refined Meshes, 1998, Supercomuting, IEEE, 13 pages.

PCT International Search Report, PCT/US2009/066098, Jul. 22, 2010.

\* cited by examiner

DYNAMIC LOAD BALANCING FOR ADAPTIVE MESHES

RELATED APPLICATIONS

This application is a continuation-in-part (CIP) of U.S. patent application Ser. No. 12/328,607 to Fisher, et al., filed Dec. 4, 2008 now abandoned, entitled METHOD FOR DYNAMIC REPARTITIONING IN ADAPTIVE MESH PROCESSING, the disclosure of which is incorporated herein by reference in its entirety.

BACKGROUND

The Fluid Dynamic governing equations for complex configurations are not generally amenable to analytical solutions. Instead, these and other similar problems are usually solved by dividing the simulation into a mesh of discrete domains, wherein the governing equations are solved inside each of these portions of the domain. Each of these portions of the domain are known as elements or cells, and the collection of all elements is known as mesh or grid.

To make solution of large meshes feasible, the meshes are partitioned to allow individual solutions to run in parallel on many processors in order to obtain a solution in a timely manner. To increase solution accuracy, the mesh undergoes adaptation, often referred to as Adaptive Mesh Refinement (AMR), by locally refining and coarsening the mesh to improve the resolution of the mesh around phenomena of interest without an excessive increase in computational effort. For example, highly refined meshes are required to accurately model flow physics and compute desired functions such as drag, lift, moments, and other flow phenomena including shock waves and vortices.

In order to run efficiently, however, the load on each processor must be the same. The adaptive solution causes the load to become un-balanced among parallel processors, and therefore decreases the efficiency of the parallel solution by orders of magnitude.

Solutions address this problem by repartitioning the mesh to balance the loads between processors. Solutions typically include an evaluation step to determine if the adaptive mesh is sufficiently unbalanced to warrant a repartitioning. Where repartitioning is justified, the adapted mesh typically is divided into new subgrids and reassigned to new processors in a manner that does not minimize the cost of data movement. Another evaluation step determines if the remapping cost is less than the computational gain that would be achieved through balanced partitions.

The remapping cost of these methods are very high because the repartitioning method is not truly dynamic. Current methods require operator input, the process is essentially starting over and repartitioning the mesh from scratch. The remapping costs of these methods typically include saving the solution and then repartitioning and retransmitting all the data again on restart. These constraints typically make it infeasible to reparation the mesh until the imbalance becomes quite large. Thus, the total efficiency is significantly reduced so systems and methods for adaptive mesh processing require a new method to maintain efficiency.

SUMMARY

The present disclosure improves over the prior art by providing a method for adaptive mesh processing that allows a solver to continue to run while facilitating a quick rebalance of the load on each processor.

One aspect of the present disclosure provides a method for dynamic rebalancing of a mesh that is partitioned to be solved on a plurality of processors in parallel, comprising: identifying the interfaces in each partition; creating super-cells from the original partitions (FIG. 3B), a remainder forming a free-cell region (FIG. 3C, region 36); determining optimal movement of the free cells (via repartitioning or other methods) to the appropriate processors; and combining each one of the super-cells with a portion of the repartitioned free-cell region to form a plurality of balanced partitions (FIG. 3f).

Another aspect of the present disclosure provides a method for finding a solution to a large-scale numerical simulation, comprising: forming a mesh; placing partitions in the mesh to run the simulation on a plurality of processors; executing an iterative solver to find the solution; and periodically rebalancing the partitioned mesh with a dynamic load balancing method.

Other systems, methods, features, and advantages of the present disclosure will be or become apparent to one with skill in the art upon examination of the following drawings and detailed description. The features, functions and advantages that have been discussed can be achieved independently in various embodiments of the present invention or may be combined in yet other embodiments further details of which can be seen with reference to the following description and drawings.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Configurations for systems and methods to perform adaptive mesh processing are described herein. Specific details of certain embodiments are set forth in the following description and the associated figures to provide a thorough understanding of such embodiments. One skilled in the art will understand, however, that alternate embodiments may be practiced without several of the details described in the following description.

The invention may be described herein in terms of functional and/or logical block components and various processing steps. For the sake of brevity, conventional techniques related to data transmission, signaling, network control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

The following description may refer to components or features being "connected" or "coupled" or "bonded" together. As used herein, unless expressly stated otherwise, "connected" means that one component/feature is in direct physically contact with another component/feature. Likewise, unless expressly stated otherwise, "coupled" or "bonded" means that one component/feature is directly or indirectly joined to (or directly or indirectly communicates with) another component/feature, and not necessarily directly physically connected. Thus, although the figures may depict example arrangements of elements, additional intervening elements, devices, features, or components may be present in an actual embodiment.

In some embodiments the present disclosure provides a method for dynamic load balancing of a large-scale numerical simulation, where the simulation employs a mesh that has been partitioned to run on a plurality of processors in parallel.

A primary example of a large-numerical simulation that fits this description is a Computational Fluid Dynamics (CFD) model. Other candidates include, for example, Computer-aided Engineering (CAE) tasks that employ partitioned grids to run on parallel processors, such as Finite Element Modeling (FEM) or Computational Electromagnetic (CEM) Analysis. The present disclosure is intended to include these examples and any other numerical analysis that employ a mesh that is partitioned to run on parallel processors.

Figure 1:
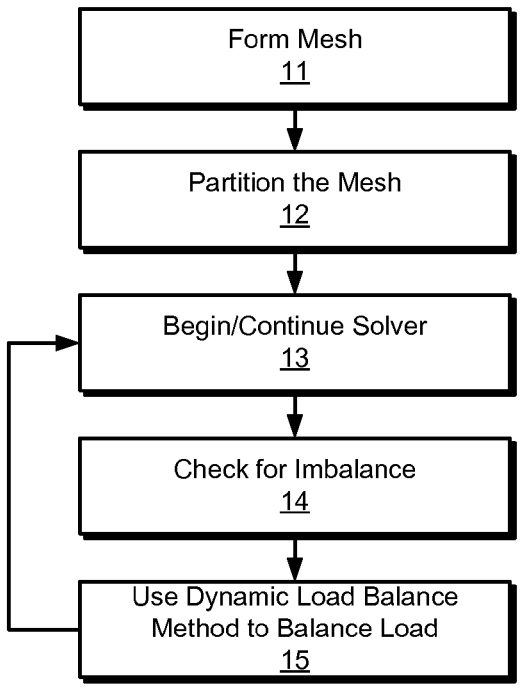
FIG. 1 is a flowchart demonstrating a method for finding a solution to a large-scale numerical simulation.

Referring to FIG. 1, one aspect of the present disclosure provides a method for finding a solution to a large-scale numerical simulation using parallel processors, comprising forming a mesh to represent the simulation 11; partitioning the mesh to run on parallel processors 12; beginning the solver 13; periodically checking for imbalance between the partitions of the mesh 14, wherein if an imbalance is found, a dynamic repartitioning method is used to repartition the mesh and rebalance the load 15; and continuing the solver 13.

The simulation must be one that can be represented in a mesh. Meshes are appropriate when solving a large numerical problem that is not suitable for numerical analysis methods and must be solved by iteration. The mesh may be of any shape and may be structured or unstructured.

Complex meshes are commonly partitioned to be solved on several processors in parallel. The partitions usually divide the mesh into equal portions to balance the load between the parallel processors. The present method may use any solver that is compatible with the circumstances described in this disclosure.

This invention will allow efficient dynamic rebalancing of the work if the load becomes imbalanced for any reason. Currently mesh adaptation is the main driver for such an imbalance, but there are other events that could also cause the work to become imbalanced.

There are several appropriate triggering mechanisms for beginning the dynamic repartitioning method. The method may be scheduled to run at a particular time interval or after a certain number of operations have been completed. If the load is balanced at the planned time interval, or if the load is within a chosen range of a balanced load, the repartitioning of the mesh should be aborted.

Alternatively, the method for dynamic load balancing of the mesh may be triggered by a measure of the load on each processor. Under this control scheme, the repartitioning method would be started whenever the load becomes unbalanced beyond a chosen threshold. Another alternative method is to allow a user to trigger the dynamic repartitioning method.

Figure 2:
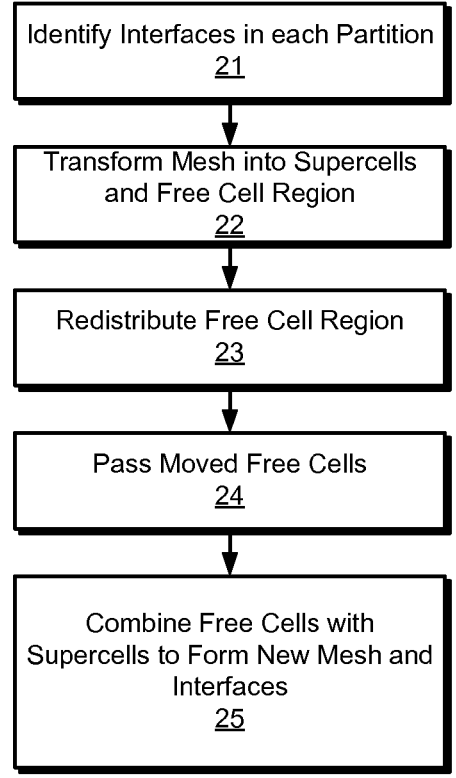
FIG. 2 is a flowchart demonstrating a method for dynamic load balancing in accordance with the present disclosure.

Referring to FIG. 2, another aspect of the present disclosure presents a method for dynamic repartitioning of a mesh for solving a large-scale numerical simulation, comprising identifying the interfaces in each partition 21; creating super-cells from the original partitions, a remainder forming a free-cell region 22; determining optimal movement of the free cells 23; and passing moved free-cells to the respective processor 24 to combine with the super-cells and form a new partition 25.

The original mesh may be partitioned using any available means prior to running the solution as the original partition is created statically. Once the solver is running, the present method requires some means for identifying the interfaces in each partition. As with the static partitioning, these means are known to those with skill in the art. Super-cells are created from the original partitions. In one embodiment, the super-cells may be created and the free-cell region may be formed by stripping cells from the edges of the partition interfaces. In another embodiment, the free-cell region may be created by stripping cells from each partition according to a marching method from interfaces. The free-cell region is then partitioned using an appropriate algorithm and recombined with the corresponding super-cells to create a new partition scheme that is balanced.

The method of the present disclosure is advantageous over the prior art because the super-cells remain with the corresponding processors and the moved free-cells make up a small percentage of the total cells within a partition. The number of interfaces remains the same. Thus, instead of retransmitting the entire grid and solution on restart, the present method only requires exchanging the moved data in parallel to the other processes. This will minimize the cost of performing the repartitioning and ultimately result in faster solutions.

Figure 3A:
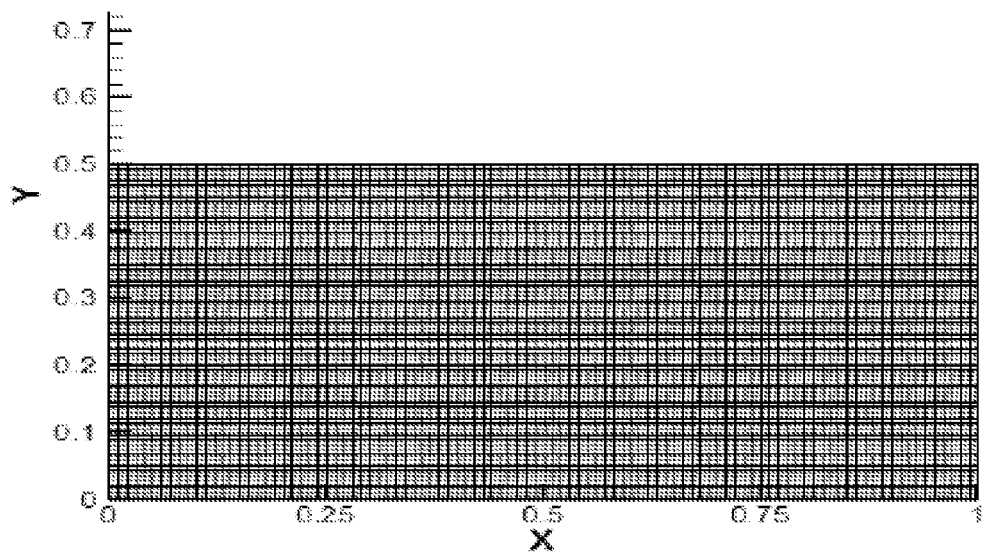
FIGS. 3A-3F are illustrations showing a mesh at different stages of the steps shown in FIG. 2.

The steps of the present method are illustrated in FIGS. 3A-3F. FIG. 3A displays a mesh in an original form. While the figure shows a 2-dimensional mesh, the method of the present disclosure may also be applied to 3-dimensional meshes. The method of the present disclosure is also equally suitable for use with structured and unstructured meshes of any shape or coordinate system.

Figure 3B:
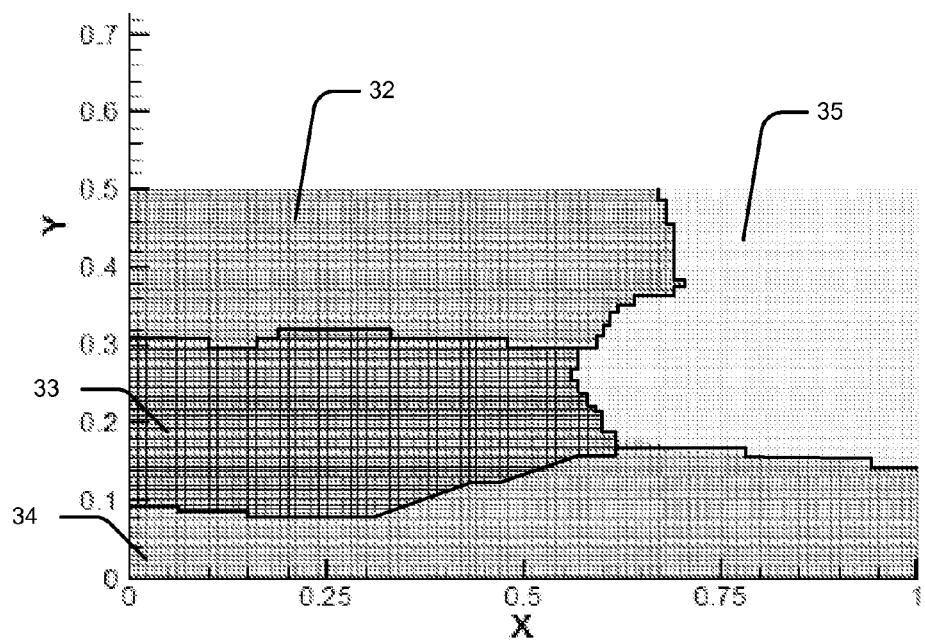

The mesh is then partitioned, as shown in FIG. 3B. In the current study the starting mesh is partitioned into four balanced cell regions 32-35, though this is not necessary for the current method to be effective. In a specific application, particularly where some initial adaptation may be anticipated, an unbalanced mesh may be used from the onset.

As mentioned above, the method of the present disclosure works with any numerical solver that employs a mesh to reach an iterative solution. The method is advantageous with an adaptive mesh, where the load becomes unbalanced over time. A primary example of this is a Computation Fluid Dynamics mesh, where the partial differential equations are not suited for analytical methods. The mesh adaptation strategy does not affect the method of the present disclosure. Thus, r-refinement, h-refinement, or p-refinement, or any other mesh adaptation strategies may be used with the present disclosure and achieve satisfactory results. The simplified example mesh in FIGS. 3A-3F does not show evidence of any adaptation, but once the solver starts the mesh may adapt to accurately capture flow features.

Figure 3C:
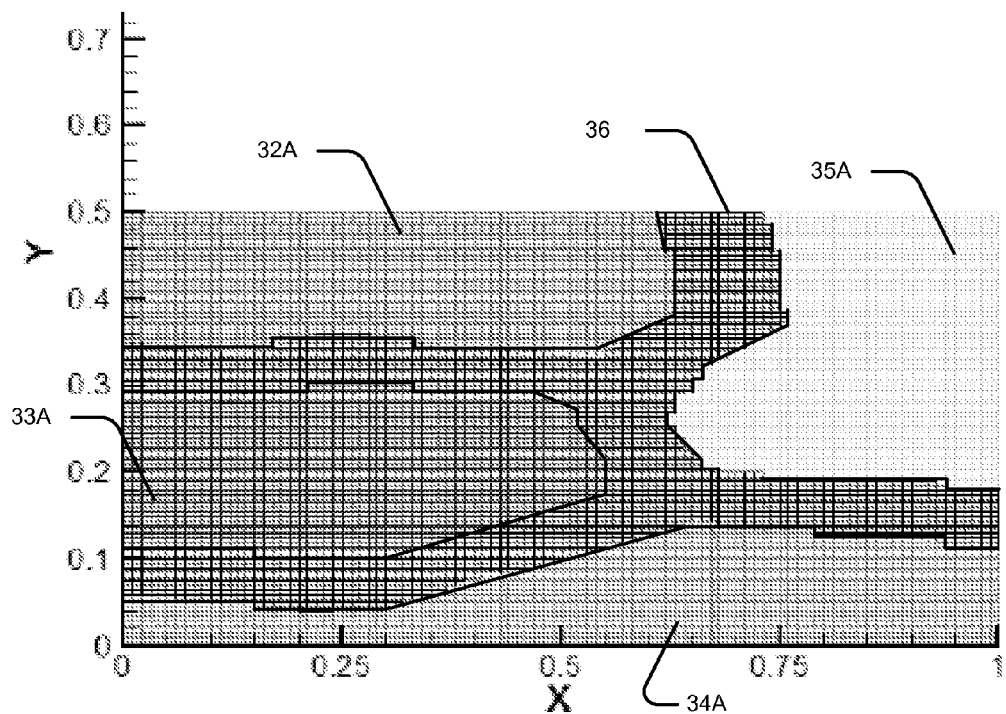
Figure 3F:
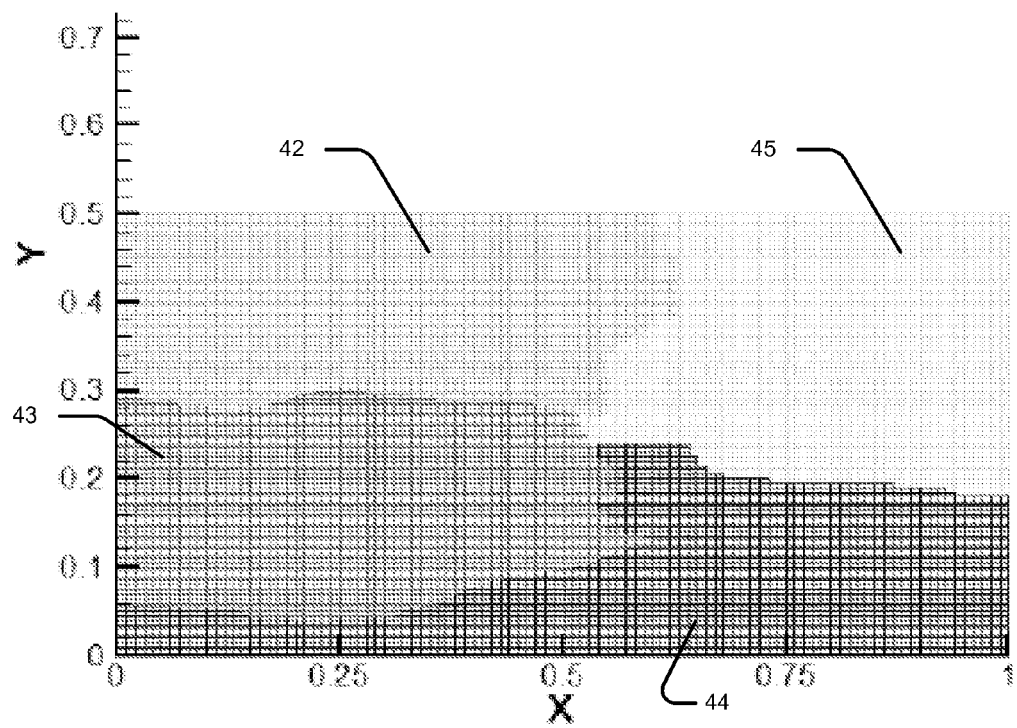

At a chosen point in the solution, a marching method may be used to strip off the outer layer of a partition based on its load imbalance. For each individual partition, this is the layer that interfaces with other partitions. The result of this step is shown in FIG. 3C. The remainder of each partition is referred to herein as a super-cell 32A, 33A, 34A, 35A. The point in time at which the repartitioning occurs may be pre-determined according to the amount of time elapsed, the changing balance of the loading of the processors, a chosen number of iterations have taken place, a user input is received, or any other desired parameter.

The mesh points at the edge of each super-cell that require input from those cells which had been stripped away will retain their value, allowing the solution to continue to run within each super-cell. This reduces the cost of the load rebalancing procedure, allowing a more efficient solution to be achieved.

According to the present disclosure, the stripped data forms a free-cell region 36 that is preferably only 10-20 percent of the entire solution for best efficiency, though larger or smaller amounts may be chosen by for a specific application. Additionally, this parameter may be measured in percentage of the entire solution, in percentage of each partition individually, in the grid size of the mesh, or any other fraction of a known parameter measuring the grid or individual partitions. Alternatively, the fraction from each partition may be chosen to create super-cells of the same size.

Figure 3E:
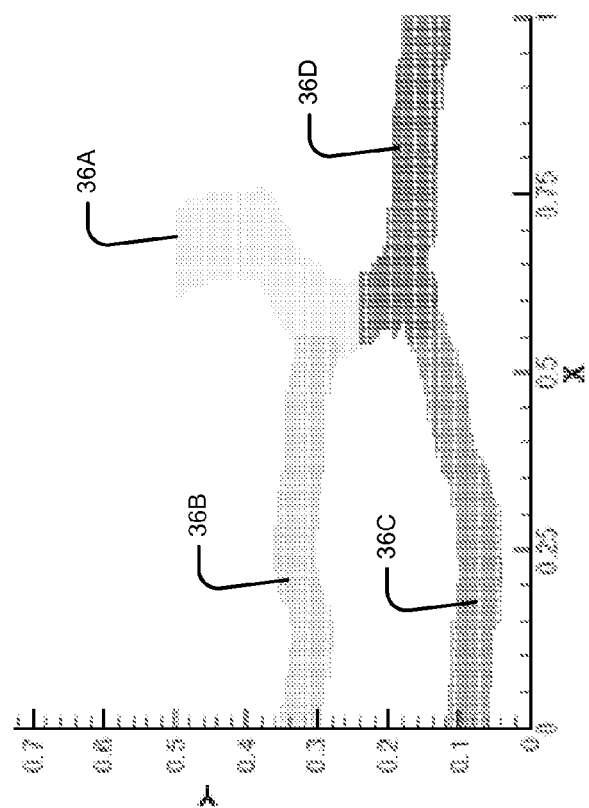
Figure 3D:
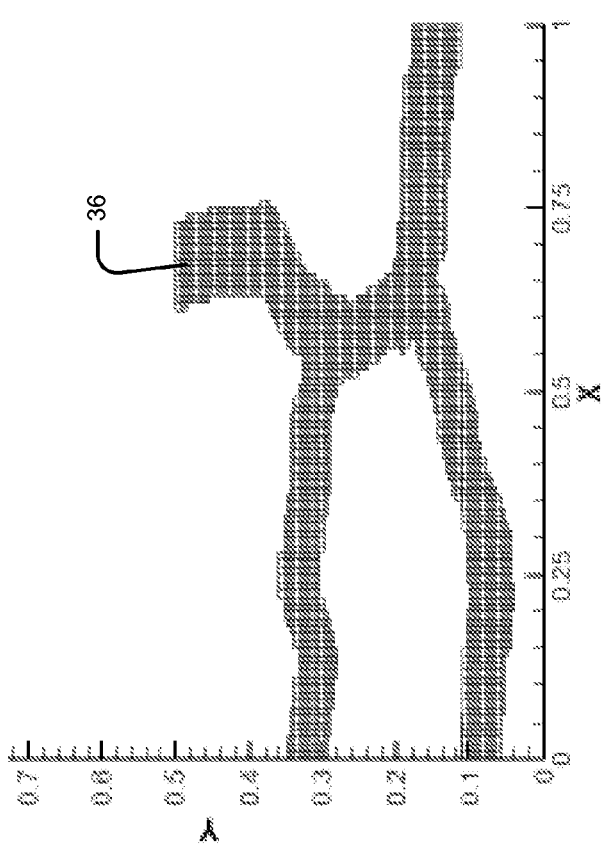

FIG. 3D isolates the free-cell region 36. The outer layers of each partition, along with the partitions core (the super-cells), are rebalanced using methods that allow weighted cells and maintain minimum interfaces to correct the load imbalance. The moved free cells are then merged with the appropriate super cell to form the new partition. Data movement is only for the moved free cells which is only a small percentage of the total grid. In this specific example, the data is repartitioned into equally sized regions 36A, 36B, 36C, 36D because each super-cell is equal in size. The repartitioned free-cell region is shown in FIG. 3E. In other instances, the sizes of each of the repartitioned portions of the free-cell region may be chosen to form new partitions that are balanced. In other embodiments, the repartitioning may be unbalanced to create an unbalanced partition if desired. The number of free-cells which are moved from one processor to another will likely be far less than the overall size of the free-cell region.

As mentioned above, the method does not require a substantial amount of time compared to prior art methods because the repartitioning of the free-cell region is on a much smaller subset of the original grid. Thus, the present disclosure advantageously progresses towards a numerical solution while minimizing the limitations of the repartitioning procedure and ultimately arriving at a more efficient run time.

The method of the present disclosure allows the use of many partitioning methods based on graph theory. Other algorithms, such as those deploying multilevel diffusion, scratch-remap, wavefront diffusion, spectral load balancing, or other schemes, may be used with the present disclosure. For example, the free-cell region may be repartitioned using a method or algorithm as mentioned above, or any combination thereof.

The partitioned portions of the free-cell region are then transmitted to and joined with the receiving partition (super-cell). See FIG. 3F. The partitioned portions are preferably matched to a super-cell that is adjacent, or which has the longest common edge, in order to reduce the amount of information that must be exchanged between processors.

The new partition in the present example results in four balanced regions 42, 43, 44, 45. In the present example, because both the beginning and final partitions are equally balanced, FIGS. 3B and 3F may be compared visually to further demonstrate that the final partition is equally balanced.

In comparison with the prior art, this process is much more efficient since it preferably operates on only 10-20 percent of the full mesh and the solver does not have to stop and restart. Thus, the costs associated with rebalancing are significantly minimized in comparison with the prior art. Because the cost of the repartitioning is low, this operation can be performed before the load imbalance overwhelms the hardware.

Figure 4:
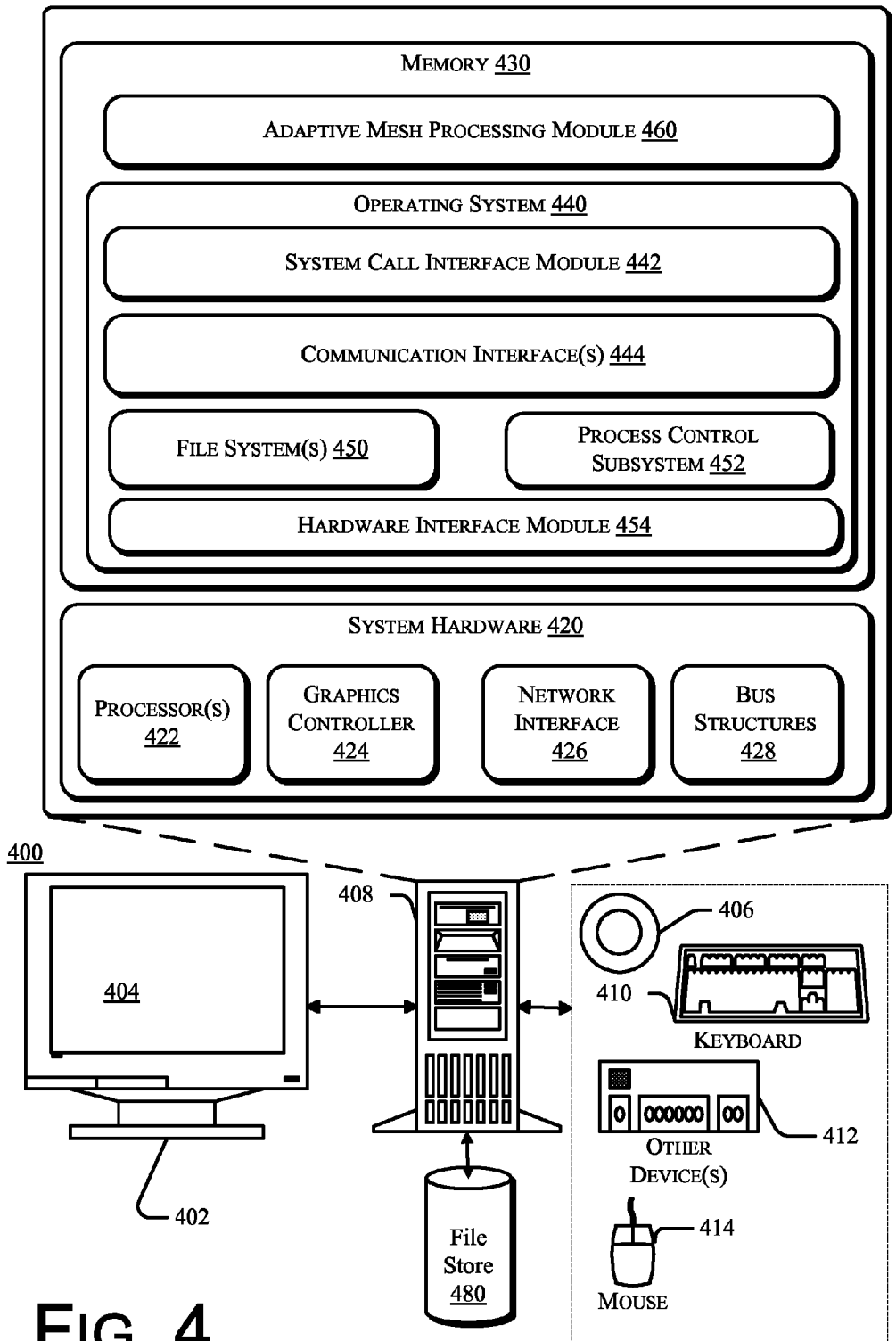
FIG. 4 is a schematic illustration of a computing device which may be adapted to implement adaptive mesh processing, according to embodiments.

In some embodiments operations depicted in FIGS. 1-2 and illustrated with reference to FIGS. 3A-3F may be implemented as a logic module in one or more general purpose computing systems. In a networked, computer-based system one or more of the computer systems may include an adaptive mesh processing module 460 adapted to implement the operations described with reference to FIGS. 1-2. FIG. 4 is a schematic illustration of a computing system 400 that may be used to implement adaptive mesh processing. In some embodiments, system 400 includes a computing device 408 and one or more accompanying input/output devices including a display 402 having a screen 404, one or more speakers 406, a keyboard 410, one or more other I/O device(s) 412, and a mouse 414. The other I/O device(s) 412 may include a touch screen, a voice-activated input device, a track ball, and any other device that allows the system 400 to receive input from a user.

The computing device 408 includes system hardware 420 and memory 430, which may be implemented as random access memory and/or read-only memory. A file store 480 may be communicatively coupled to computing device 408. File store 480 may be internal to computing device 408 such as, e.g., one or more hard drives, CD-ROM drives, DVD-ROM drives, or other types of storage devices. File store 480 may also be external to computer 408 such as, e.g., one or more external hard drives, network attached storage, or a separate storage network.

System hardware 420 may include one or more processors 422, video controllers 424, network interfaces 426, and bus structures 428. In one embodiment, processor 422 may be embodied as an Intel® Pentium IV® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics controller 424 may function as an adjunction processor that manages graphics and/or video operations. Graphics controller 424 may be integrated onto the motherboard of computing system 400 or may be coupled via an expansion slot on the motherboard.

In one embodiment, network interface 426 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 428 connect various components of system hardware 428. In one embodiment, bus structures 428 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Memory 430 may include an operating system 440 for managing operations of computing device 408. In one embodiment, operating system 440 includes a hardware interface module 454 that provides an interface to system hardware 420. In addition, operating system 440 may include a file system 450 that manages files used in the operation of computing device 408 and a process control subsystem 452 that manages processes executing on computing device 408.

Operating system 440 may include (or manage) one or more communication interfaces 444 that may operate in conjunction with system hardware 420 to transceive data packets and/or data streams from a remote source. Operating system 440 may further include a system call interface module 442 that provides an interface between the operating system 440 and one or more application modules resident in memory 430. Operating system 440 may be embodied as a UNIX operating system or any derivative thereof (e.g., Linux, Solaris, etc.), as a Windows® brand operating system, or as another type of operating system.

In one embodiment, memory 430 includes an adaptive mesh processing module 460 which implements the operations depicted in FIGS. 1-2 on a mesh as depicted in FIGS. 3A-3F. The adaptive mesh processing module 460 may include logic instructions encoded in a non-transitory computer-readable storage medium which, when executed by one or more processors 422, cause the processors 422 to dynamically partition a mesh, as described above.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A method comprising:
identifying, with a processor of a plurality of processors, one or more partition interfaces associated with a mesh that is partitioned to be solved by the plurality of processors;
creating a plurality of super-cells with the processor from original partitions, a remainder of the mesh forming a free-cell region, wherein the free-cell region includes cells of the mesh adjacent to both sides of the one or more partition interfaces;
dividing the free-cell region into a plurality of portions with the processor; and
combining each of the super-cells with at least one portion of the plurality of portions with the processor to form a plurality of new partitions.

2. The method of claim 1, wherein the mesh is a domain of at least one of a simulation in a computational fluid dynamics model or a simulation in a finite element model.

3. The method of claim 1, wherein the super-cells are created and the free-cell region is formed by stripping cells of the mesh from edges of the one or more partition interfaces and wherein the cells are stripped using a marching method.

4. The method of claim 1, wherein the free-cell region is 10-20% of a size of the mesh.

5. The method of claim 1, wherein the free-cell region is divided into the plurality of portions using a method from the group consisting of: multilevel diffusion, scratch-remap, wavefront diffusion, spectral load balancing, or a combination thereof.

6. The method of claim 1, wherein a size of each new partition is chosen to balance the mesh.

7. The method of claim 1, wherein each super-cell is combined with an adjacent portion of the plurality of portions.

8. A computer-based system to dynamically rebalance a mesh that is partitioned to be solved, comprising:
a plurality of processors adapted to operate in parallel;
a memory coupled to at least one processor of the plurality of processors, the memory comprising instructions executable by the at least one processor to:
identify one or more partition interfaces associated with the mesh;
create a plurality of super-cells from original partitions, a remainder of the mesh forming a free-cell region, wherein the free-cell region includes cells of the mesh adjacent to both sides of the one or more partition interfaces;
divide the free-cell region into a plurality of portions; and
combine each of the super-cells with at least one portion of the plurality of portions to form a plurality of new partitions.

9. The system of claim 8, wherein the mesh is a domain of at least one of a simulation in a computational fluid dynamics model or a simulation in a finite element model.

10. The system of claim 8, wherein the memory further comprises instructions executable by the at least one processor to create the free-cell region by stripping cells from edges of the one or more partition interfaces using a marching method.

11. The system of claim 8, wherein the free-cell region is 10-20% of a size of the mesh.

12. The system of claim 8, wherein the free-cell region is divided into the plurality of portions using multilevel diffusion, scratch-remap, wavefront diffusion, spectral load balancing, or a combination thereof.

13. The system of claim 8, wherein a size of each new partition is chosen to balance the mesh.

14. The system of claim 8, wherein each super-cell is combined with an adjacent portion of the plurality of portions.

15. A non-transitory computer-readable medium comprising instructions to dynamically reparation a mesh that is partitioned to be solved by a plurality of processors in parallel, the instructions executable by at least one processor of the plurality of processors to perform operations including:
identifying one or more partition interfaces associated with the mesh;
creating a plurality of super-cells from original partitions, a remainder of the mesh forming a free-cell region, wherein the free-cell region includes cells of the mesh adjacent to both sides of the one or more partition interfaces;
dividing the free-cell region into a plurality of portions; and
combining each of the super-cells with at least one portion of the plurality of portions to form a plurality of new partitions.

16. The non-transitory computer-readable medium of claim 15, wherein the mesh is a domain of at least one of a simulation in a computational fluid dynamics model or a simulation in a finite element model.

17. The non-transitory computer-readable medium of claim 15, wherein the free-cell region is 10-20% of a size of the mesh.

18. The non-transitory computer-readable medium of claim 15, wherein the free-cell region is divided into the plurality of portions using multilevel diffusion, scratch-remap, wavefront diffusion, spectral load balancing, or a combination thereof.

19. The non-transitory computer-readable medium of claim 15, wherein a size of each new partition is chosen to balance the mesh.

20. The non-transitory computer-readable medium of claim 15, wherein each super-cell is combined with an adjacent portion of the plurality of portions.

* * * * *